United States Patent
Trejo

(10) Patent No.: US 6,898,849 B2
(45) Date of Patent: May 31, 2005

(54) METHOD FOR CONTROLLING WIRE BALLS IN ELECTRONIC BONDING

(75) Inventor: Luis Trejo, Aguascalientes (MX)

(73) Assignee: Texas Instruments Incorporated, Dallas, TX (US)

( * ) Notice: Subject to any disclaimer, the term of this patent is extended or adjusted under 35 U.S.C. 154(b) by 55 days.

(21) Appl. No.: 09/961,165

(22) Filed: Sep. 21, 2001

(65) Prior Publication Data

US 2002/0056706 A1 May 16, 2002

Related U.S. Application Data

(60) Provisional application No. 60/235,682, filed on Sep. 27, 2000.

(51) Int. Cl.[7] ................................................. H01R 9/00
(52) U.S. Cl. ........................ 29/843; 29/840; 219/56.21; 228/179.1
(58) Field of Search ........................... 29/825, 832–834, 29/840, 842, 843, 846, 860; 219/56.21, 130.51; 228/179.1, 219

(56) References Cited

U.S. PATENT DOCUMENTS

| | | | |
|---|---|---|---|
| 4,390,711 A | | 6/1983 | Grudzinskas et al. |
| 4,390,771 A | * | 6/1983 | Kurtz et al. ............. 219/56.22 |
| 4,476,365 A | * | 10/1984 | Kurtz et al. ............. 219/56.22 |
| 4,476,366 A | * | 10/1984 | Kurtz et al. ............. 219/56.22 |
| 4,482,794 A | * | 11/1984 | Kurtz et al. ............. 219/56.22 |
| 4,523,071 A | * | 6/1985 | Bancroft et al. ......... 219/56.22 |
| 4,687,897 A | * | 8/1987 | McKiel, Jr. ............. 219/56.21 |
| 4,707,579 A | * | 11/1987 | McKiel, Jr. ............. 219/56.22 |
| 4,889,274 A | * | 12/1989 | Ramsey .................. 228/180.5 |
| 4,909,427 A | * | 3/1990 | Plaisted et al. .............. 228/4.5 |
| RE333,330 | * | 9/1990 | Ogasawara et al. .... 219/137 PS |
| 5,601,740 A | * | 2/1997 | Eldridge et al. ......... 219/130.4 |
| 5,601,749 A | | 2/1997 | Eldridge et al. |
| 5,628,922 A | * | 5/1997 | Chen ...................... 219/56.21 |
| 5,763,849 A | * | 6/1998 | Nakao .................... 219/56.21 |
| 5,773,780 A | * | 6/1998 | Eldridge et al. ......... 219/56.22 |
| 6,062,462 A | * | 5/2000 | Gillotti et al. ........... 228/180.5 |
| 6,555,401 B2 | | 4/2003 | Koduri |
| 2001/0035452 A1 | | 11/2001 | Test et al. |

* cited by examiner

Primary Examiner—A. Dexter Tugbang
Assistant Examiner—Donghai D. Nguyen
(74) Attorney, Agent, or Firm—W. Daniel Swayze, Jr.; W. James Brady; Frederick J. Telecky, Jr.

(57) ABSTRACT

A method for forming a substantially spherical free air ball on a fine non-oxidizable wire in a computerized bonder, which has a computerized flame-off (EFO) apparatus operable to generate pulses of different heights and widths. A train of EFO current pulses is applied between electrode and wire; examples are shown in FIGS. 8 and 9. The pulse heights are controlled to melt a predetermined volume of wire while minimizing the heat-affected zone of the wire as well as the wire necking, thus creating free air balls of small diameters and high ball/wire strength. The pulse widths are controlled to create a substantially spherical ball shape. The pulse train of various heights and widths is minimized in order to minimize the time needed for one bond and to maximize the number of bonds provided per second.

6 Claims, 2 Drawing Sheets

US 6,898,849 B2

METHOD FOR CONTROLLING WIRE BALLS IN ELECTRONIC BONDING

This application claims the benefit of Provisional Application No. 60/235,682, filed Sep. 27, 2000.

FIELD OF THE INVENTION

The present invention is related in general to the field of semiconductor devices and electronic systems and more specifically to the controlled operation of computerized bonding machines used in the assembly of integrated circuit chips.

DESCRIPTION OF THE RELATED ART

In integrated circuit (IC) assembly, an IC chip is first mechanically attached to the chip mount pad of a prefabricated leadframe. Thereafter, the chip bond pads are electrically connected to the leadframe segments by a plurality of electrical conductors. Typically, the IC bond pads (usually made of aluminum, copper, gold, or alloys thereof) are positioned around the chip perimeter and vary in size from 45×45 $\mu$m to 150×150 $\mu$m. The technology trend is strongly aiming at ever smaller pad sizes. Furthermore, the pitch of the smallest pads is shrinking from 60 $\mu$m to 50 $\mu$m and less, while two and more rows of pads are staggered behind each other.

The most common connection technologies employ wires in ball, stitch, and wedge bonding techniques, as well as ribbons. The usual conductor materials are gold, copper, and aluminum, and alloys thereof. While the development of wire bonding technology has progressed through more than two decades, the recent trends towards smaller chip bond pad sizes and pitches quoted above demand rapid innovation and refinement of bonding capabilities. Many efforts have been extended towards improvements and control of the process of wire ball formation, other efforts focussed on the computer control of the bonding process itself.

In U.S. Pat. No. 4,390,711, issued on Jun. 28, 1983 (Kurtz et al., "Bonding Wire Ball Forming Method and Apparatus"), copper or aluminum wires are surrounded by a shroud of inert gas. A preset count of electrical pulses for arc discharges between the wire and the shroud (which functions as complementary electrode) is applied. The pulses have substantially uniform width and duty cycle, pulse height and pulse frequency. In the preferred embodiment, constant pulse width and pulse height are maintained while the number of pulses are counted and metered for metering the delivered energy. This method, together with the requirement of a gas shroud, is too expensive for today's high number of bonds required per second in semiconductor mass production.

Similarly, related techniques, which are based on protective gas shrouds and/or time-consuming arc energy delivery, do not meet the goals for cost effectiveness in semiconductor mass production driven by flexibility and low cost requirements. Examples are described in U.S. Pat. No. 4,476,365, issued on Oct. 9, 1984 (Kurtz et al., "Cover Gas Control of Bonding Ball Formation"); U.S. Pat. No. 4,476,366, issued on Oct. 9, 1984 (Kurtz et al., "Controlled Bonding Wire Ball Formation"); U.S. Pat. No. 4,482,794, issued on Nov. 13, 1984 (Kurtz et al., "Pulse-Width Control of Bonding Ball Formation"); U.S. Pat. No. 4,889,274, issued on Dec. 26, 1989 (Ramsey, "Gas Mixture for Use in Control and Formation of Ball Bonds"); U.S. Pat. No. 4,523,071, issued on Jun. 11, 1985 (Bancroft et al., "Method and Apparatus for Forming a Ball at the End of a Wire"); U.S. Pat. No. 4,687,897, issued on Aug. 18, 1987 (McKiel, Jr., "Flame-Off Limited Circuit for Wire Bonding Ball Forming Apparatus"); and U.S. Pat. No. 4,707,579, issued on Nov. 17, 1987 (McKiel, Jr., "Real-Time Tail Length Monitor for Wire Bonding Flame-Off Apparatus").

Other techniques propose to control specific features in wire ball bonding, such as ball size or shape, but do not concurrently control important side effects such as heat-affected zone and necking. Consequently, the overall quality of the newly formed bond, as measured by shear and pull tests and accelerated stress tests, is questionable. Furthermore, additional tools, materials, or environments always add cost in manufacturing. Examples can be found in U.S. Pat. No. 4,909,427, issued on Mar. 20, 1990 (Plaisted et al., "Bonding Wire Ball Formation"); U.S. Pat. No. 5,628,922, issued on May 13, 1997 (Chen, "Electrical Flame-off Wand"); U.S. Pat. No. 5,601,740, issued on Feb. 11, 1997 (Eldridge et al., "Method and Apparatus for Wirebonding, for Severing Bond Wires, and for Forming Balls on the End of Bond Wires"); U.S. Pat. No. 5,773,780, issued on Jun. 30, 1998 (Eldridge et al., "Method of Severing Bond Wires and Forming Balls at their Ends"); U.S. Pat. No. 6,062,462, issued on May 16, 2000 (Gillotti et al., "Apparatus and Method for Making Predetermined Fine Wire Ball Sizes").

For automated bonders having an associated computer-controlled vision system, a computer-implemented method for inspecting and measuring a ball-shaped wire bond formed by an automated bonder pre-programmed to attach a connecting bond onto a bond pad of an integrated circuit, has been described in U.S. patent application Ser. No. 60/230, 396, filed on Sep. 6, 2000 (Koduri, "Method of Controlling Bond Process Quality by Measuring Wire Bond Features"). This disclosure is related to the quoted application. Unfortunately, though, that application does not address methods how the physical features of the wire balls can be controlled by the ball-forming process as executed by the computer-controlled bonder.

An urgent need has therefore arisen for a fast, reliable and flexible method to control wire ball formation together with the related side effects of necking and wire heat-affected zone. The method should be flexible enough to be applied for different IC product families with a wide spectrum of design variations, and for different bond machines. The method should spearhead solutions towards the goals of improved product yield and reliability, preferably without investment in new equipment.

SUMMARY OF THE INVENTION

A method is disclosed for forming a substantially spherical free air ball on a fine non-oxidizable wire in a computerized bonder, which has a computerized flame-off (EFO) apparatus operable to generate pulses of different heights and widths. A train of EFO current pulses is applied between electrode and wire. The pulse heights are controlled to melt a predetermined volume of wire while minimizing the heat-affected zone of the wire as well as the wire necking, thus creating free air balls of small diameters and high ball/wire strength. The pulse widths are controlled to create a substantially spherical ball shape. The pulse train of various heights and widths is minimized in order to minimize the time needed for one bond and to maximize the number of bonds provided per second.

Specifically, it is an aspect of the invention to keep the number of pulses in a pulse train to only two or three pulses, especially in a train of progressively lower pulse heights yet various pulse widths.

It is an aspect of the present invention to be applicable to a variety of different wire ball sizes, wire diameters and wire looping configurations, as well as chip bond pad layout designs and metallizations.

Another aspect of the invention is to improve product quality by process control and simplification, and to enhance reliability assurance by controlling thermomechanical stress, minimizing environmental exposure time, and incorporation of software programs aiming at bond formation control at no extra cost.

Another aspect of the invention is to introduce ball formation and bond process concepts which are flexible so that they can be applied to many families of semiconductor products and bonders, and are general so that they can be applied to several future generations of products and equipments.

Another aspect of the invention is to reach these goals without new capital investment or production constraints.

These aspects have been achieved by the teachings of the invention concerning methods suitable for mass production. Various modifications have been employed for the sequence of ball formation steps.

In the first embodiment of the present invention, a pulse current of a pre-determined height is applied for a specific period of time. Directly afterwards, a second pulse of lesser height and time is applied, followed by a third pulse of still lesser height yet longer duration. The heat-affected zone is minimized and the free air ball diameter is kept small.

In the second embodiment of the invention, a pulse current of a pre-determined height is applied for a specific period of time. Directly afterwards, a second pulse of much lesser height and time is applied, followed by a third pulse of intermediate height yet longer duration. The free air ball is approximately spherical and wire necking is avoided.

In the third embodiment of the invention, only two pulse currents of different heights and lengths are applied. The time spent for creating the free air ball is minimized.

The technical advances represented by the invention, as well as the aspects thereof, will become apparent from the following description of the preferred embodiments of the invention, when considered in conjunction with the accompanying drawings and the novel features set fourth in the appended claims.

DETAILED DESCRIPTION OF THE PREFERRED EMBODIMENTS

Figure 1:
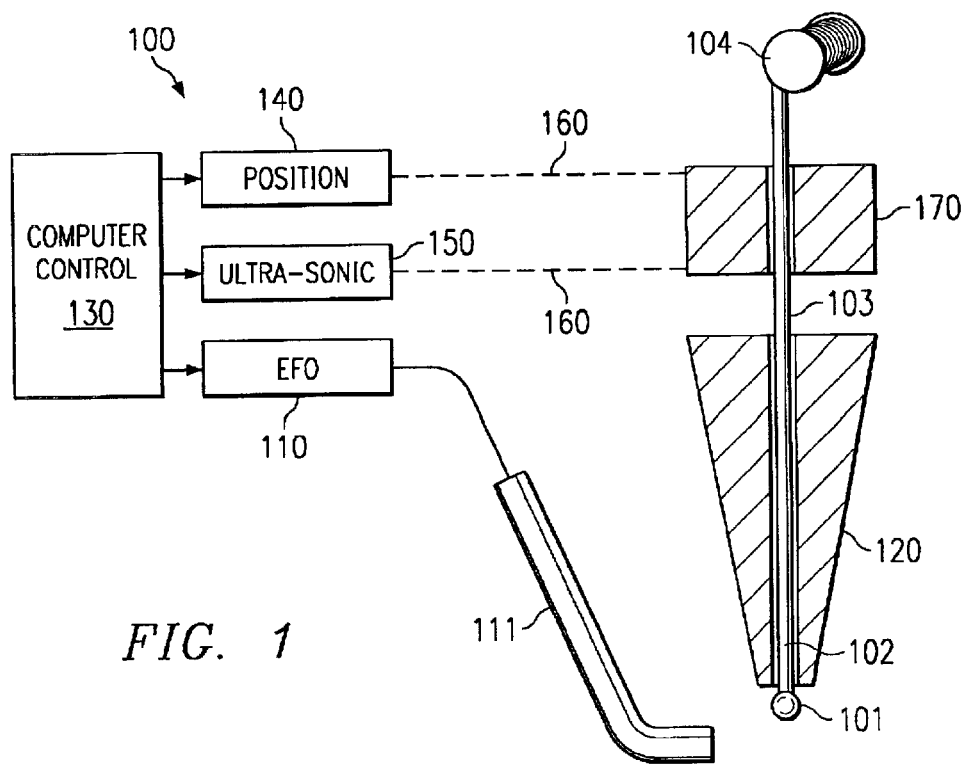
FIG. 1 is a simplified and schematic illustration of the electronic flame-off (EFO) apparatus as operated in computerized bonders in semiconductor assembly.

In the schematic FIG. 1, a bonding machine, generally designated 100, as used in the assembly of semiconductor integrated circuit (IC) chips, is controlled by a computer 130. In these "bonders", the process of forming a free air "ball" 101, which will be bonded to a semiconductor contact pad, employs an electric arc generator 110, commonly referred to as "electronic flame-off (EFO) system". Its critical part is an electrode 111 placed close to the free end 102 of the bonding wire 103, which is supplied by a spool 104 and strung through a capillary 120. A generator applies a high voltage (positive or negative) to the electrode 111 in order to break the electrical gap between the electrode and the wire end by a gaseous discharge. A current can then flow having a magnitude and duration high enough for melting the wire. The surface tension of the liquefied wire material causes the formation of an approximately spherical air "ball" at the end of the wire.

Computerized bonders are commercially available. Examples of automated bonders having state-of-the-art EFO capability include ABACUS SA II, made by Texas Instruments Incorporated, Dallas, Tex., 75243, USA, and Bonder 8028, made by Kulicke & Soffa Industries, Inc., Willow Grove, Pa., 19090, USA. In these bonders, computer control is further provided to a precision-mechanical positioning system 140 and an ultrasonic power supply 150. Through sophisticated coupling means 160, the mechanical positioning and the ultrasonic agitation are coupled to the capillary fixture ("horn") 170 and thus to the capillary 120.

In the preferred embodiment of the invention, standard round wire of diameter between about 18 to 33 $\mu$m is used, preferably 20 to 25 $\mu$m. For bonding to aluminum-metallized bond pads, the wire consists of gold, with optional very small contents of beryllium, copper, palladium, iron, silver, calcium or magnesium (which are sometimes employed to control the heat-affected wire zone in ball formation, which would be mechanically weak for bending or other deformation stresses. For bonding to copper-metallized bond pads, the wire consists of copper or gold of comparable diameter. The free air ball 101, created by the EFO spark technique, has a typical diameter from about 1.2 to 1.6 wire diameters.

Figure 2:
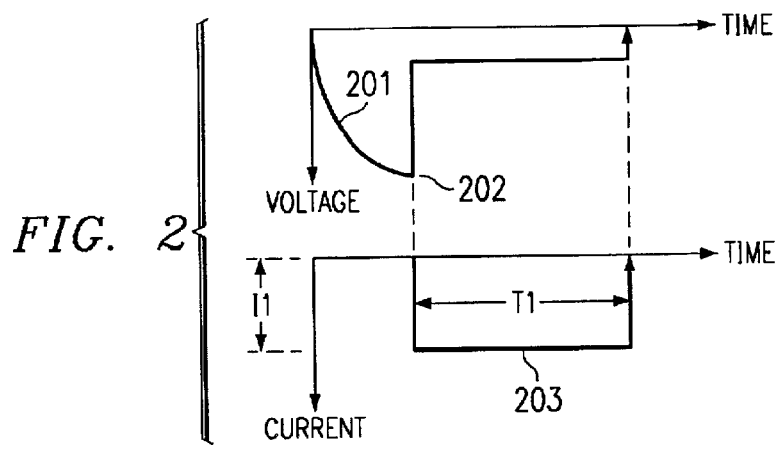
FIG. 2 is a simplified illustration of an EFO current pulse (current vs. time) as created by the EFO voltage characteristic (voltage vs. time).

In FIG. 2, the actual process of forming a free air ball is illustrated in two diagrams, voltage vs. time and current vs. time. The first step consists of increasing the voltage in trace 201 to the value 202 which is high enough to break the electrically insulating gap between the electrode 111 (in FIG. 1) and the wire-to-be-bonded 102. Typically, the electrically insulating is the atmospheric ambient between electrode and wire. In the next step, a constant current 203 of value I1 flows for the length of time T1, forming a current pulse for metering an exact amount of energy to the wire. This energy provides heat to increase the temperature beyond the wire melting point, thus allowing the formation of a "ball". Typically, the current I1 is in the range from about 15 to 30 mA, and the time T1 in the range from about 1.5 to 4 ms. After time T1, the current is interrupted and the re-sequencing process starts anew.

Figure 3:
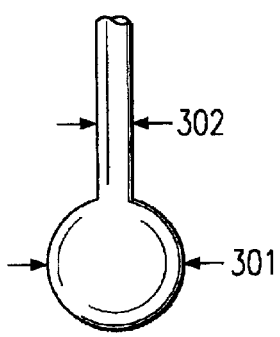
FIG. 3 is a schematic illustration of a free air ball having optimized interface with the wire.
Figure 4:
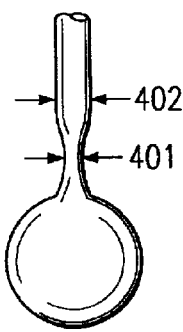
FIG. 4 is a schematic illustration of a free air ball having strong wire necking.

FIG. 3 shows a correctly formed free air ball; the ball diameter 301 is slightly enlarged relative to the wire diameter 302 for clarity purposes. In contrast, FIG. 4 shows a free air ball malformed by severe necking 401 relative to the wire diameter 402. This deformation is unacceptable, because it will cause the finished wire bond to break under pull and push testing. The EFO sequence of this invention avoids wire necking.

Figure 5:
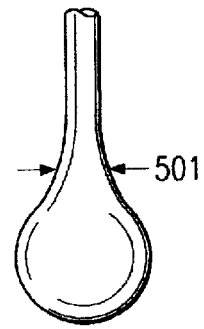
FIG. 5 is a schematic illustration of a free air ball having at thickened wire portion adjacent to the ball.

The free air ball shown in FIG. 5 is not an outright reject, because its thickened wire neck 501 will not cause malfunctioning; however, a thickened ball/wire interface is still undesirable due to poor quality control. The EFO pulse sequence of this invention avoids poorly controlled ball/wire interfaces.

Figure 6:
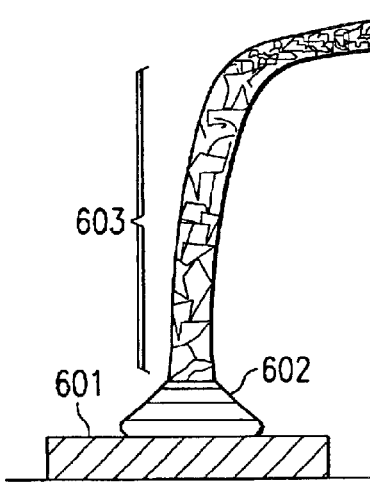
FIG. 6 is a schematic illustration of a wire bond attached to a substrate, having a wire with a long heat-affected zone.
Figure 7:
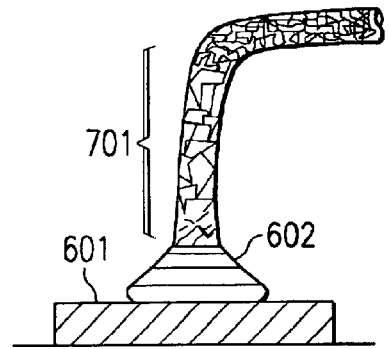
FIG. 7 is a schematic illustration of a wire bond attached to a substrate, having a wire with a short heat-affected zone.

FIGS. 6 and 7 illustrate the detrimental effect of the heat-affected zone in wire bonding. In the bonding process, the free air ball, freshly formed on the tip of the wire and still at high temperature, although no longer liquid, is pressured against the metal of the bonding pad 601 to form a so-called nail-head 602. The bonding pad 601 of most IC chips is made of aluminum, often alloyed with 0.5 to 2% copper and/or 0.5 to 1% silicon. In other chips, the bond pad is copper, overlaid with a layer of nickel and an outermost layer of gold (see, for instance, U.S. Patent Application No. 60/192,108, filed on Mar. 24, 2000, Test et al., "Wire Bonding Process for Copper-Metallized Integrated Circuits").

The wire bonding process begins by positioning the semiconductor chip on a heated pedestal to raise the temperature to between 150 and 300° C. The wire is strung through a capillary; at the tip of the wire, a free air ball is created using either a flame or a spark technique, as described above, with the ball having a typical diameter from about 1.2 to 2.5 wire diameters. The capillary is moved towards the chip bonding pad 601 and the ball is pressed against the metallization of the pad, forming the nail head 602. For pads of aluminum, a combination of compression force and ultrasonic energy create the formation of gold-aluminum intermetallics and thus a strong metallurgical bond. The compression (also called Z- or mash) force is typically between about 17 and 75 g; the ultrasonic time between about 10 and 20 ms; the ultrasonic power between about 20 and 50 mW. At time of bonding, the temperature usually ranges from 150 to 270° C. In the case of gold or copper wire on copper pad, only metal interdiffusion takes place in order to generate the strong weld.

It is important for the present invention that recent technical advances in wire bonding allow the formation of small yet reliable ball contacts and tightly controlled shape of the wire loop. Such advances can, for instance, be found in the computerized bonders quoted above. Moving the capillary in a predetermined and computer-controlled manner through the air will create a wire looping of exactly defined shape. For instance, with the recent technical advances, rounded, trapezoidal, linear and customized loop paths can be formed. However, these advances are imperiled whenever the heat-affected zone 603 is more than about 3 to 4 wire diameters, as shown in FIG. 6. Any looping starting in the heat-affected zone would be mechanically weak, since the larger metal crystallites in the heat-affected zone have a tendency to side off each other more easily under pulling force than the micro-crystallites of the original wire. A heat-affected zone having a length 701 of only 3 to 4 wire diameters or less (see FIG. 7) is generally acceptable for forming geometrically tight, yet mechanically strong wire looping. The sequences of EFO pulses disclosed in this invention keep the heat-affected within the small length indicated in FIG. 7.

Figure 8:
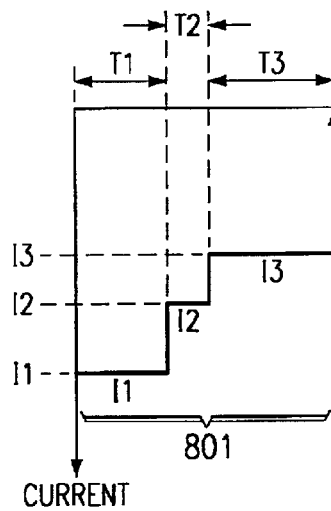
FIG. 8 is a sequence of EFO current pulses (current vs. time) according to the first embodiment of the invention.
Figure 8:
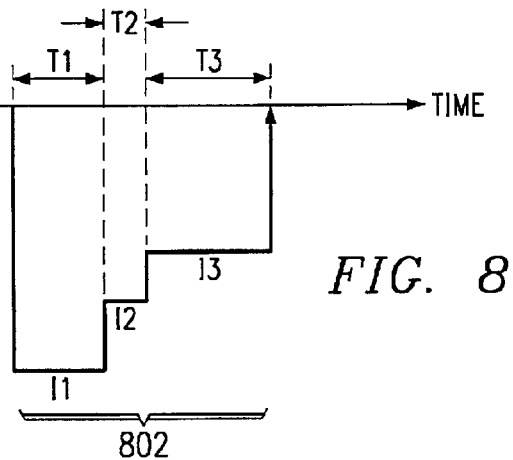

The sequence of EFO current pulses of the first embodiment of the present invention is illustrated in FIG. 8. Plotted in FIG. 8 is EFO current versus time. One train of pulses 801 consists of a first pulse of pre-determined height I1 applied for a specific period of time T1. Directly afterwards, a second pulse of lesser height I2 and time T2 is applied, followed by a third pulse of still lesser height I3 yet longer duration T3. This sequence of pulses is designed to create small, substantially spherical free air balls and to minimize the heat-affected zone, especially for gold wires. Examples of parameter values for gold wire diameter, EFO current height and time length, with designations as in FIG. 8, are listed in the following Table 1.

TABLE 1

| | Gold wire diameter 23–25 μm | | | |
|---|---|---|---|---|
| | Ball diameter 70–80 μm | | Ball diameter 65–75 μm | |
| | Height (mA) | Length (ms) | Height (mA) | Length (ms) |
| First pulse | I1 = 10 | T1 = 2 | I1 = 8 | L1 = 2 |
| Second pulse | I2 = 7 | T2 = 1 | I2 = 5 | T2 = 1 |
| Third pulse | I3 = 5 | T3 = 5 | I3 = 4 | T3 = 5 |

It is an option to omit the second pulse so that the pulse train provides only two consecutive pulses I1 and I3.

After completing the first train of pulses 801, it may be followed by another train 802, creating the next free air ball.

It is within the scope of the invention that heights and lengths of the current pulses can, in principle, be reversed from the order illustrated above, or selected so that any other controlled pulse train, variable in height and length, is formed for providing specific ball diameters or shapes.

Figure 9:
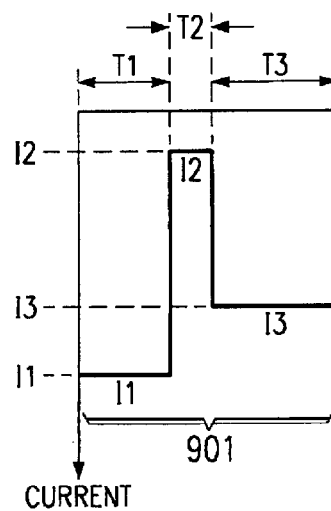
FIG. 9 is a sequence of EFO current pulses (current vs. time) according to the second embodiment of the invention.
Figure 9:
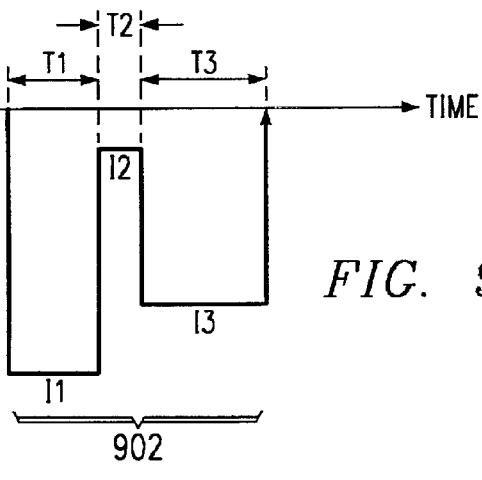

The sequence of EFO current pulses of the second embodiment of the present invention is illustrated in FIG. 9. Plotted in FIG. 9 is EFO current versus time. One train of pulses 901 consists of a first pulse of pre-determined height I1 applied for a specific period of time T1. Directly afterwards, a second pulse of much lesser but not zero height I2 and time T2 (to keep the arc burning) is applied, followed by a third pulse of intermediate height I3 yet longer duration T3. In the period T2, the EFO arc is still maintained, while overheating of the newly formed free air ball is avoided and the ball is still kept hot for the next pulse I3. This sequence of pulses is designed to provide the energy needed for creating small, substantially spherical free air balls and avoiding wire necking. Examples of parameter values for gold wire diameter, EFO current height and time length, with designations as in FIG. 9, are listed in the following Table 2.

TABLE 2

| | Gold wire diameter (μm) 23–25 | | | |
|---|---|---|---|---|
| | Ball diameter 70–80 μm | | Ball diameter 65–75 μm | |
| | Height (mA) | Length (ms) | Height (mA) | Length (ms) |
| First pulse | I1 = 10 | T1 = 2 | I1 = 8 | L1 = 2 |
| Second pulse | I2 = 1 | T2 = 1 | I2 = 1 | I2 = 1 |
| Third pulse | I3 = 5 | T3 = 5 | I3 = 5 | I3 = 5 |

The first train of pulses 901 may be followed by another train 902, creating the next free air ball.

It is within the scope of the invention that heights and lengths of the current pulses can, in principle, be reversed from the order illustrated above. Pulse number, height and length also can be varied or selected to form any other controlled pulse train in order to produce desired free air ball diameters and shapes as a function of the wire material and diameter used. The basis for the calculation of pulses in a train are pre-determined empirical data stored in the master file of the computerized bonder.

In all these modifications and combinations, however, it is important to calculate the minimum train of consecutive EFO current pulses of various heights and widths in order to minimize the time needed for creating a single bond and thus to maximize the number of bonds manufacturable per second. In this fashion, the full economic benefit of the present invention can be obtained.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention can be applied to non-oxidizable wires other than gold as long as the ball formation is performed in ambient atmosphere. As another example, the invention can be extended to ball formation under protective atmosphere for oxidizable wire materials such as aluminum. As another example, the invention can be applied to coated wires in ambient atmosphere. It is therefore intended that the appended claims encompass any such modifications or embodiments.

I claim:

1. A method of forming a ball at the end of a wire, comprising the step of:

exposing an end of the wire to a plurality of current pulses, wherein each pulse in said plurality of said current pulses has a lower magnitude than a preceding pulse, wherein the plurality of current pulses comprises three pulses, wherein the first of the three pulses is of a first duration, the second of the three pulses is of a second duration, the second duration being shorter than the first duration, and the third of the three pulses is of a third duration, the third duration being longer than the first and second durations, and wherein said first, second, and third pulses are successively applied to form said ball.

2. The method of claim 1 wherein a last pulse in said plurality is of a magnitude that about half the magnitude of the first pulse in said plurality of current pulses.

3. The method of claim 1 wherein the duration of the third pulse in said plurality is over twice as long as the duration of the first pulse in said plurality of current pulses.

4. A method of forming a ball at the end of a wire, comprising the steps of:

exposing the end of the wire to a first current pulse;

exposing the end of the wire to a second current pulse, wherein the second pulse is of lesser magnitude than the first pulse; and exposing the end of the wire to a third current pulse to form said ball, wherein the third pulse is of a magnitude between the magnitudes of the first and second pulses, wherein the first of the three pulses is of a first duration, the second of the three pulses is of a second duration, the second duration being shorter than the first duration, and the third of the three pulses is of a third duration, the third duration being longer than the first and second durations.

5. The method of claim 4 wherein the third current pulse is of a magnitude that is about half the magnitude of the first current pulse.

6. The method of claim 4 wherein the duration of the third current pulse is over twice as long as the duration of the first current pulse.

* * * * *